(12) United States Patent
Ellens et al.

(10) Patent No.: US 6,657,379 B2
(45) Date of Patent: Dec. 2, 2003

(54) ILLUMINATION UNIT HAVING AT LEAST ONE LED AS LIGHT SOURCE

(75) Inventors: Andries Ellens, Den Haag (NL); Günter Huber, Schrobenhausen (DE); Franz Kummer, Munich (DE)

(73) Assignee: Patent-Treuhand-Gesellschaft fur Elektrische Gluehlampen mbH, Munich (DE)

( * ) Notice: Subject to any disclaimer, the term of this patent is extended or adjusted under 35 U.S.C. 154(b) by 0 days.

(21) Appl. No.: 10/188,718

(22) Filed: Jul. 3, 2002

(65) Prior Publication Data

US 2003/0030368 A1 Feb. 13, 2003

(30) Foreign Application Priority Data

Jul. 16, 2001 (DE) .......................................... 101 33 352

(51) Int. Cl.$^7$ .................................................. H01J 1/62
(52) U.S. Cl. ........................ 313/503; 313/483; 313/485; 313/486
(58) Field of Search ................... 252/301.4 F; 313/484, 313/485, 486, 487, 483

(56) References Cited

U.S. PATENT DOCUMENTS

| 5,998,925 A | 12/1999 | Shimizu et al. | |
| 2002/0032118 A1 * | 3/2002 | Oshio | ......................... 501/120 |
| 2003/0030038 A1 * | 2/2003 | Mitomo et al. | ............. 252/500 |
| 2003/0052595 A1 * | 3/2003 | Ellens et al. | ................. 313/501 |

FOREIGN PATENT DOCUMENTS

| DE | 19638667 | 4/1998 |
| DE | 201 08 013.3 | 8/2001 |
| EP | 09 36682 B1 | 8/1999 |
| EP | 09 36682 A4 | 8/1999 |
| WO | WO 01/08453 A1 | 2/2001 |

OTHER PUBLICATIONS

Joost Willem Hendrik Van Krevel; "On New Rare–Earth Doped M–Si–Al–O–N Materials Luminescence Properties and Oxidation Resistance"; Jan. 1, 2001; pp. 144–157.

* cited by examiner

Primary Examiner—Nimeshkumar D. Patel
Assistant Examiner—Holly Harper
(74) Attorney, Agent, or Firm—Frishauf, Holtz, Goodman & Chick, P.C.

(57) ABSTRACT

An illumination unit having at least one LED as light source, the LED emitting primary radiation in the range from 300 to 485 nm, this radiation being partially or completely converted into longer-wave radiation by phosphors which are exposed to the primary radiation of the LED, in which unit the conversion takes place at least with the aid of a phosphor which emits yellow-orange with a peak emission wavelength at 540 to 620 nm and originates from the class of the Eu-activated sialons, the sialon corresponding to the formula $M_{p/2}Si_{12-p-q}Al_{p+q}O_qN_{16-q}:Eu^{2+}$, where M=Ca individually or in combination with Mg or Sr, where q=0 to 2.5 and p=0 to 3.

15 Claims, 9 Drawing Sheets

ILLUMINATION UNIT HAVING AT LEAST ONE LED AS LIGHT SOURCE

TECHNICAL FIELD

The invention is based on an illumination unit having at least one LED as light source in accordance with the preamble of claim 1. This is in particular an LED which emits in the visible or white region and is based on an LED which emits primarily UV/blue.

BACKGROUND ART

An illumination unit having at least one LED as light source, which emits, for example, white light, is currently obtained predominantly by combining a Ga(In)N-LED, which emits in the blue at approximately 460 nm, and a yellow-emitting YAG:$Ce^{3+}$ phosphor (U.S. Pat. No. 5,998,925 and WO 98/12757). For good color rendering, two different yellow phosphors are often used, as described in WO 01/08453. A problem in this case is that the two phosphors often have different temperature characteristics, even if their structures are similar. A known example is the yellow-luminescent Ce-doped Y garnet (YAG:Ce) and the (Y,Gd) garnet which, by comparison, is luminescent at a longer wavelength. This leads to fluctuations in the color locus and changes in the color rendering at different operating temperatures.

The publication "On new rare-earth doped M—Si—Al—O—N materials" by van Krevel, TU Eindhoven 2000, ISBN 90-386-2711-4, Chapter 11 has disclosed a class of phosphor materials which are known as sialons (α-sialons), which represents a contraction of their structure. An emission in the range from 560 to 590 nm with excitation at 365 nm or 254 nm is achieved by means of doping with Eu.

DISCLOSURE OF THE INVENTION

It is an object of the present invention to provide an illumination unit having at least one LED as light source, the LED emitting primary radiation in the range from 300 to 485 nm, this radiation being partially or completely converted into longer-wave radiation by phosphors which are exposed to the primary radiation of the LED, which is distinguished by a high level of constancy at fluctuating operating temperatures. A further object is to provide an illumination unit which emits white light and in particular has a good color rendering and a high output.

This object is achieved by the following features: An illumination unit having at least one LED as light source, the LED emitting primary radiation in the range from 300 to 485 nm, this radiation being partially or completely converted into longer-wave radiation by phosphors which are exposed to the primary radiation of the LED, wherein conversion takes place at least with the aid of a phosphor which emits yellow-orange with a peak emission wavelength at 540 to 620 nm and originates from the class of the Eu-activated sialons, the sialon corresponding to the formula $M_{p/2}Si_{12-p-q}Al_{p+q}O_qN_{16-q}$:$Eu^{2+}$, where M=Ca individually or in combination with at least one of the metals Sr or Mg, where q=0 to 2.5 and p=0.5 to 3.

Particularly advantageous configurations are given in the dependent claims.

According to the invention, the phosphor used for the LED-based illumination unit is a sialon which emits yellow-orange and originates from the class of the Eu-activated sialons, the sialon corresponding to the formula $M_{p/2}Si_{12-p-q}Al_{p+q}O_qN_{16-q}$:$Eu^{2+}$, where M=Ca individually or in combination with Sr and Mg, where q=0 to 2.5 and p=0.5 to 3. It is preferable to select a high value for p, specifically p=2 to 3, and a relatively low value for q, specifically q=0 to 1. Instead of pure Al, it is possible in particular to use a mixture of Al and Ga, with the Ga forming up to 20 mol %.

The Eu content, which replaces some of the cation M, should be 0.5 to 15%, preferably 1 to 10%, of the M cation, so that the emission wavelength can be selected particularly accurately and the light efficiency can also be optimized. An increase in Eu content generally shifts the peak emission toward longer wavelengths. Surprisingly, it has been found that a changing concentration of the cation M also shifts the peak emission wavelength. At a low concentration of the M cation, good absorption by the Eu ion can be obtained by selecting the amount of the Eu ion to be over 10% of the M cation.

Particular advantages of this phosphor in connection with an LED-based illumination unit are its high efficiency, its excellent thermal stability (no sensitivity to changes in the operating temperature) and a surprisingly high luminescence extinction temperature, as well as the high color rendering which can be achieved thereby, in particular in combination with at least one further phosphor. The extinction temperature, i.e. the temperature at which the luminescence is destroyed on account of the heat supplied, is even so high as to lie outside the preselected measurement range (maximum 140° C.).

A further advantage of this class of phosphors is that the starting material (in particular $Si_3N_4$) is already present in extremely finely dispersed form.

Consequently, it is not necessary to mill the phosphor. By contrast, conventional phosphors, such as YAG:Ce have to be milled, so that they remain dispersed in the casting resin and do not sink to the bottom. This milling operation often leads to loss of efficiency. Despite having a fine grain size of the starting material, the phosphor according to the invention has a surprisingly high absorption. This phosphor therefore no longer has to be milled, with the result that one operation is saved and there are no efficiency losses. Typical mean grain sizes of the phosphor are 0.5 to 5 $\mu$M.

In addition to the production of a colored light source by excitation by means of UV radiation or blue primary emission from an LED, in particular the generation of white light with the aid of this phosphor offers advantages. This is achieved either with an UV-emitting LED as primary light source, by using at least two and preferably three phosphors. An alternative is to use a blue-emitting LED and one or two phosphors. Excellent results are achieved with a mixture of thermally stable garnet phosphor, preferably YAG:Ce, and an Eu-doped sialon.

White light with good color rendering is also achieved by the combination of a blue LED (e.g. primary emission at 450 to 485 nm), a green phosphor (emission between 490–525 nm) and a yellow-orange (YO) emitting phosphor (emission: 540–620 nm).

The YO phosphor used is $M_{p/2}Si_{12-p-q}Al_{p+q}O_qN_{16-q}$:$Eu^{2+}$. In this formula, M is Ca individually or in combination with Sr and/or Mg. This YO phosphor has an excellent thermal stability and very good luminescence at relatively high temperatures which are typical of LEDs: up to 80° C., it did not show any drop in luminescence within the scope of the measurement accuracy. By contrast, the conventional yellow phosphors have a significantly measurable drop in luminescence at 80° C.: this drop is 5% for YAG and 10–20% for (Y,Gd)AG.

When a blue LED is used as the primary light source, in particular mixtures of an Eu-doped sialon with a chlorosilicate (Eu-doped or Eu,Mn-doped) or with $SrAl_2O_4:Eu^{2+}$ achieve good color renderings of over Ra=75. Compared to a mixture of YAG and (Y,Gd)AG, the color rendering is almost identical; the efficiency is even slightly higher and the thermal extinction is considerably improved. If necessary, the color rendering in the red can be improved still further by the addition of a red phosphor, e.g. $Sr_2Si_5N_8:Eu^{2+}$ or $SrS:Eu^{2+}$.

A white mixture can also be produced on the basis of an UV-emitting LED by means of this Eu-doped sialon together with a blue phosphor, such as for example $BaMgAl_{10}O_{17}:Eu^{2+}$ (BAM) or $(Ca,Sr,Ba)_5(PO_4)_3Cl:Eu^{2+}$ (SCAP). If necessary, the color rendering can be improved still further by adding a green phosphor (for example Eu-doped thiogallates or Sr aluminate) and a red phosphor (for example Eu-doped Sr nitride or Sr sulfide). A further possibility is to use the Eu-doped sialon as the only phosphor with excitation by a blue-emitting LED (peak emission of approximately 470 to 485 nm).

Depending on the $Eu^{2+}$ content, the body color of this material is light yellow to deep yellow/yellow-orange. On account of the excellent thermal stability and also mechanical stability, this Eu sialon is eminently suitable for use as an environmentally friendly yellow or yellow-orange pigment. This applies in particular if M is replaced by more than 10% of Eu.

BRIEF DESCRIPTION OF THE DRAWINGS

The invention is explained in more detail below with reference to a plurality of exemplary embodiments. In the drawing.

BEST MODE FOR CARRYING OUT THE INVENTION

Figure 1:
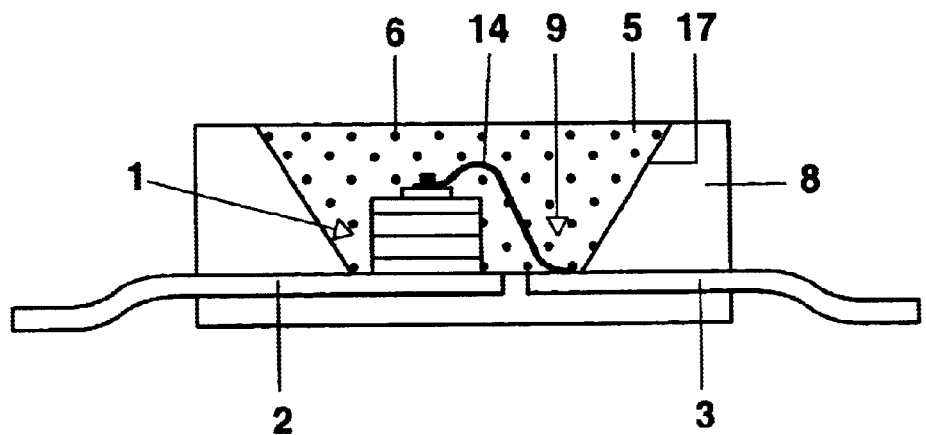
FIG. 1 shows a semiconductor component which is used as light source (LED) for white light.

For use in a white LED together with an GaInN chip, by way of an example a structure which is similar to that described in U.S. Pat. No. 5,998,925 is used. The structure of a light source of this type is shown specifically for white light in FIG. 1. The light source is a semiconductor component (chip 1) of type InGaN, with a peak emission wavelength of 460 nm, having a first and a second electrical connection 2, 3, which are embedded in an opaque base housing 8 in the region of a recess 9. One of the connections 3 is connected to the chip 1 via a bonding wire 14. The recess has a wall 17 which serves as reflector for the blue primary radiation of the chip 1. The recess 9 is filled with a potting compound 5 which as its main constituents contains an epoxy casting resin (80 to 90% by weight) and phosphor pigments 6 (less than 15% by weight). There are also further small amounts of, inter alia, methyl ether and Aerosil. The phosphor pigments are a mixture of YAG:Ce and sialon pigments.

Figure 2:
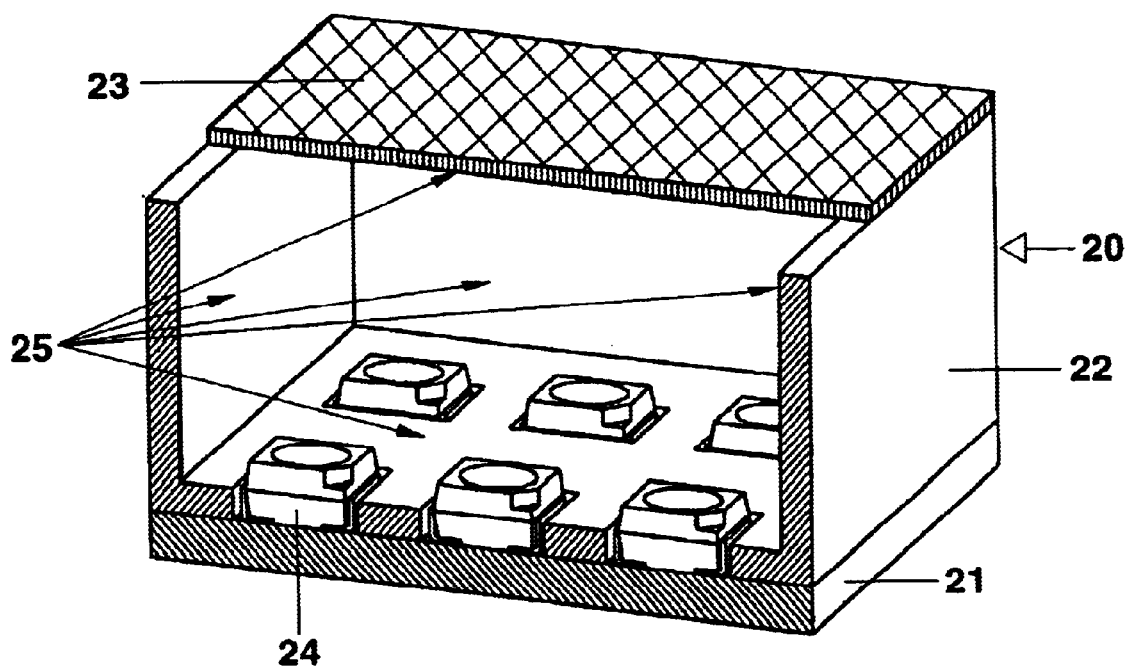
FIG. 2 shows an illumination unit with phosphors in accordance with the present invention.

FIG. 2 shows part of a surface-lighting fitting 20 as illumination unit. It comprises a common support 21, to which a cuboidal outer housing 22 is adhesively bonded. Its upper side is provided with a common cover 23. The cuboidal housing has cutouts in which individual semiconductor components 24 are accommodated. They are UV-emitting LEDs with a peak emission of 360 nm. The conversion into white light takes place by means of conversion layers which are positioned directly in the casting resin of the individual LEDs, in a similar manner to that described in FIG. 1, or layers 25 which are arranged on all surfaces which are accessible to the UV radiation. These include the inner surfaces of the side walls of the housing, of the cover and of the base part. The conversion layers 25 consist of three phosphors which emit in the yellow, green and blue spectral regions using the phosphors according to the invention.

A number of phosphors of the sialon type are compiled in table 1. These are predominantly Ca sialons of type $Ca_{1.5}Si_9Al_3N_{16}$, where a proportion of the cation Ca which amounts to between 1 and 10 mol % has been replaced by Eu. Typical quantum efficiencies of these phosphors are 70 to 80%, with the peak emission of 580 nm when the Eu doping is low shifting to approximately 590 nm when the Eu doping is high.

Good results can also be achieved with Ca sialons of the type $CaSi_{10}Al_2N_{16}$. In this case too, a high quantum efficiency of over 80% is achieved with a relatively high Eu doping. On account of the lower Ca content, the peak wavelength is surprisingly at shorter wavelengths. This makes it possible to deliberately set the emission, if appropriate in combination with the possibility of also influencing the position of emission by means of the Eu content. To achieve sufficient absorption, if the Ca content is low it is also possible to exchange between 10 and 25% of Eu for Ca, preferably 10 to 15%.

Figure 3A:
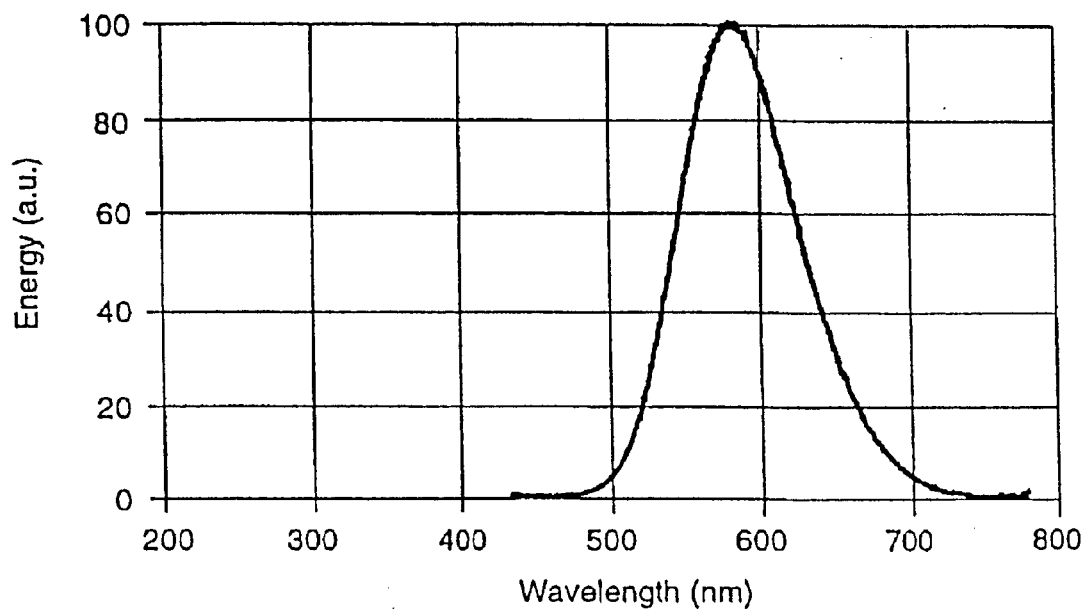
FIGS. 3 to 6 show the emission spectrum and the reflection spectrum of various sialon phosphors in accordance with the present invention.
Figure 3B:
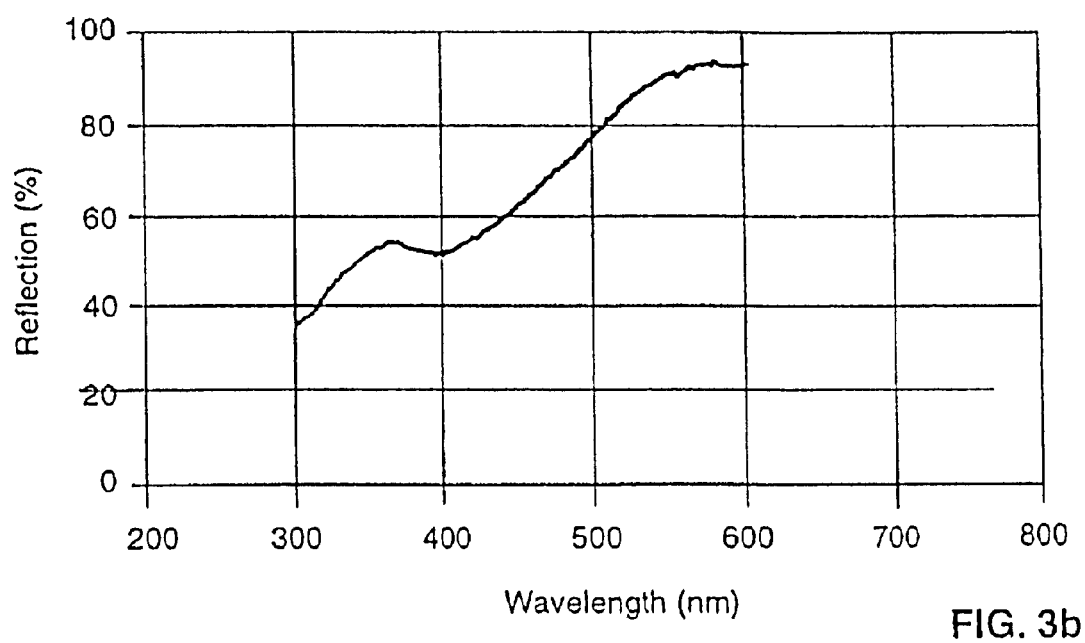
Figure 3C:
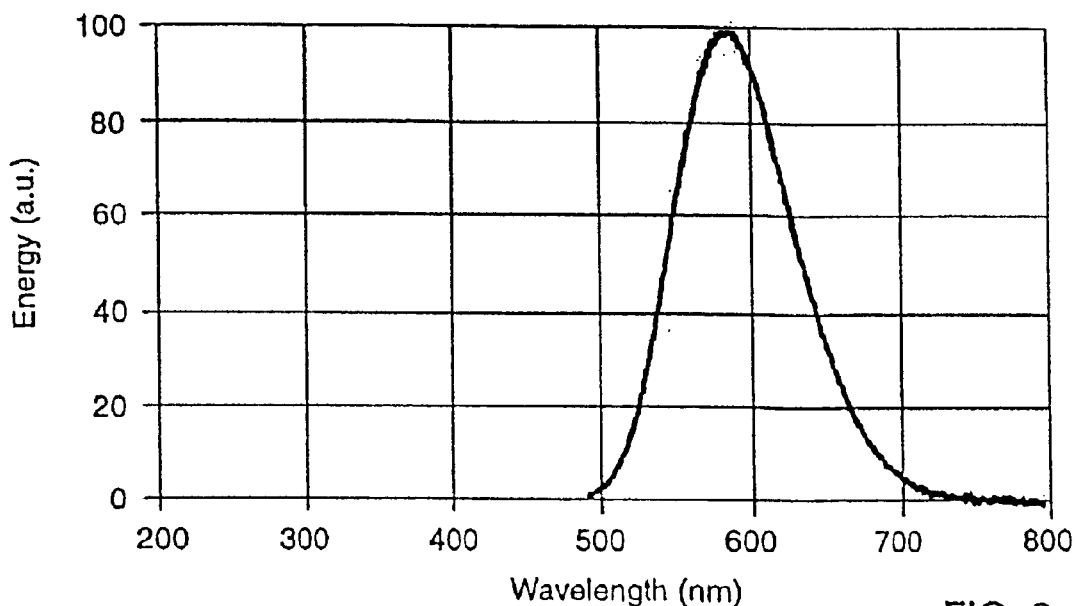
Figure 3D:
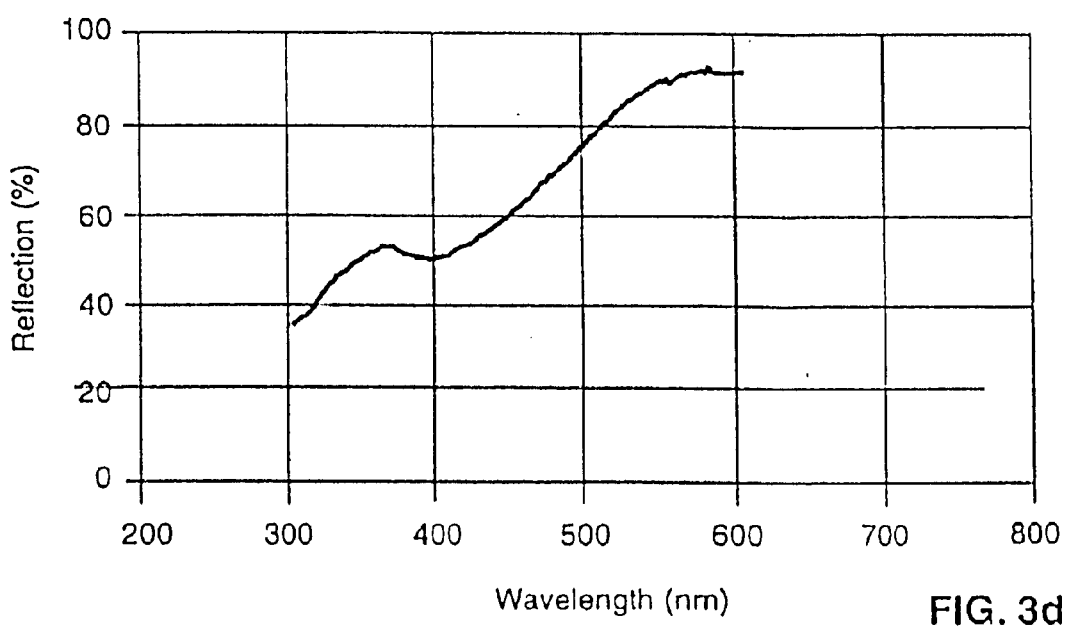
Figure 4A:
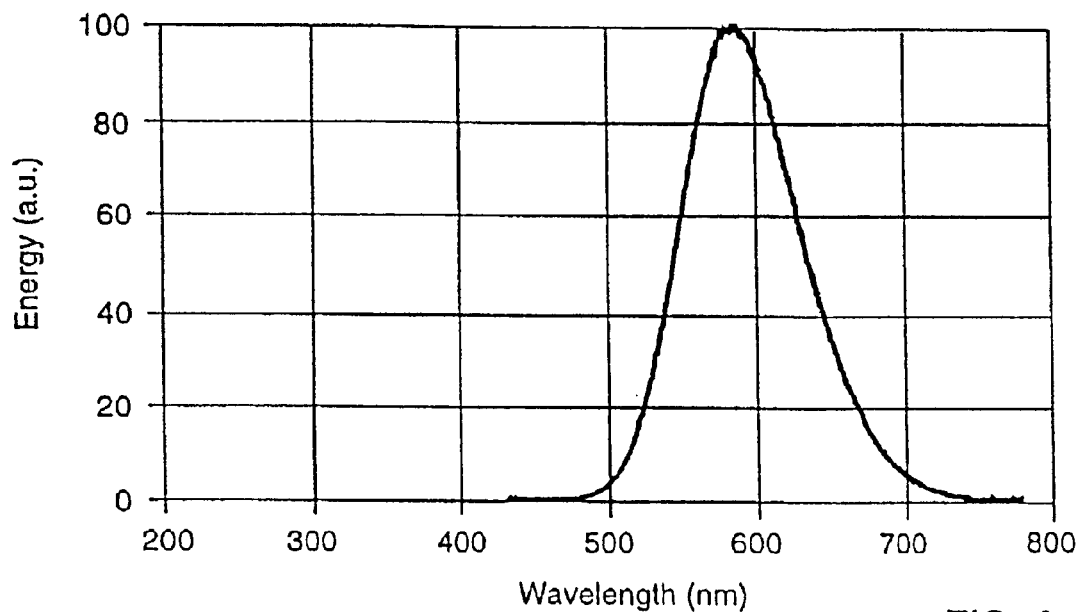
Figure 4B:
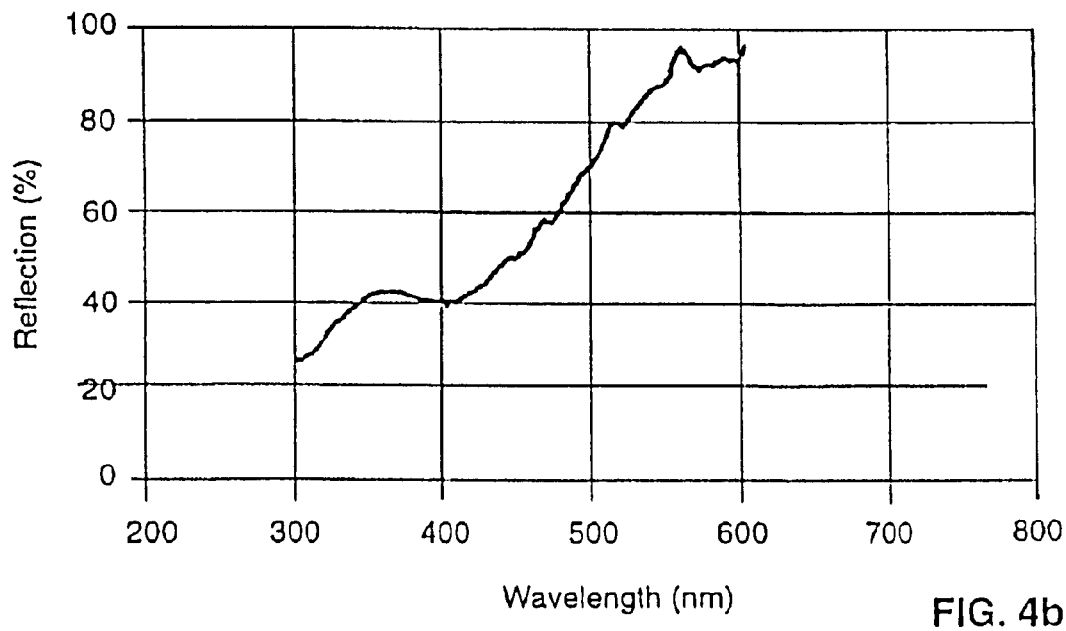
Figure 5A:
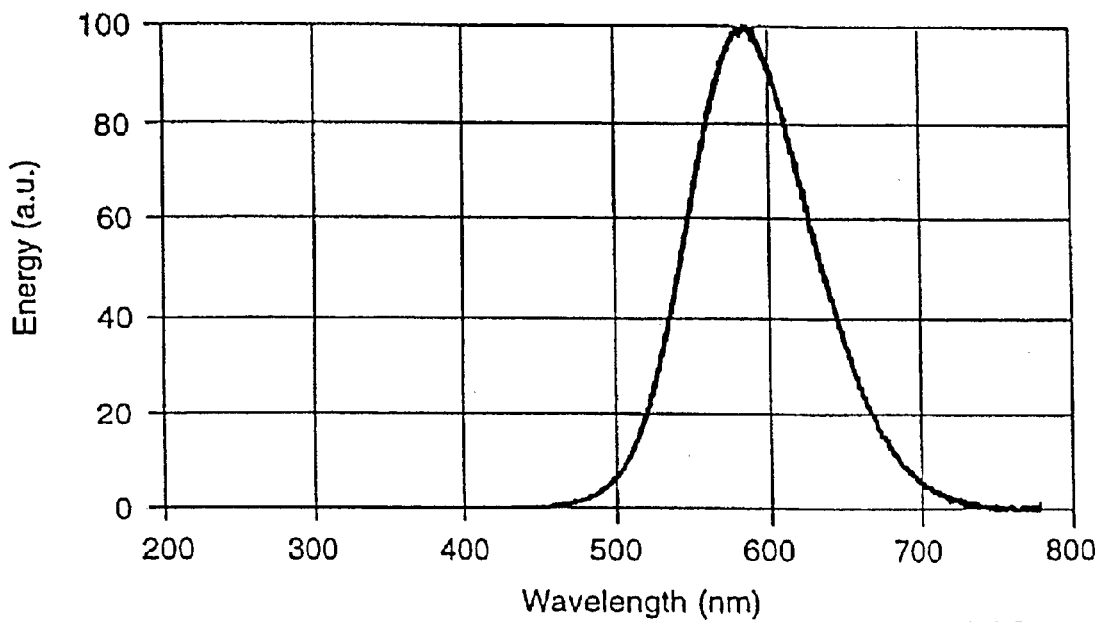
Figure 5B:
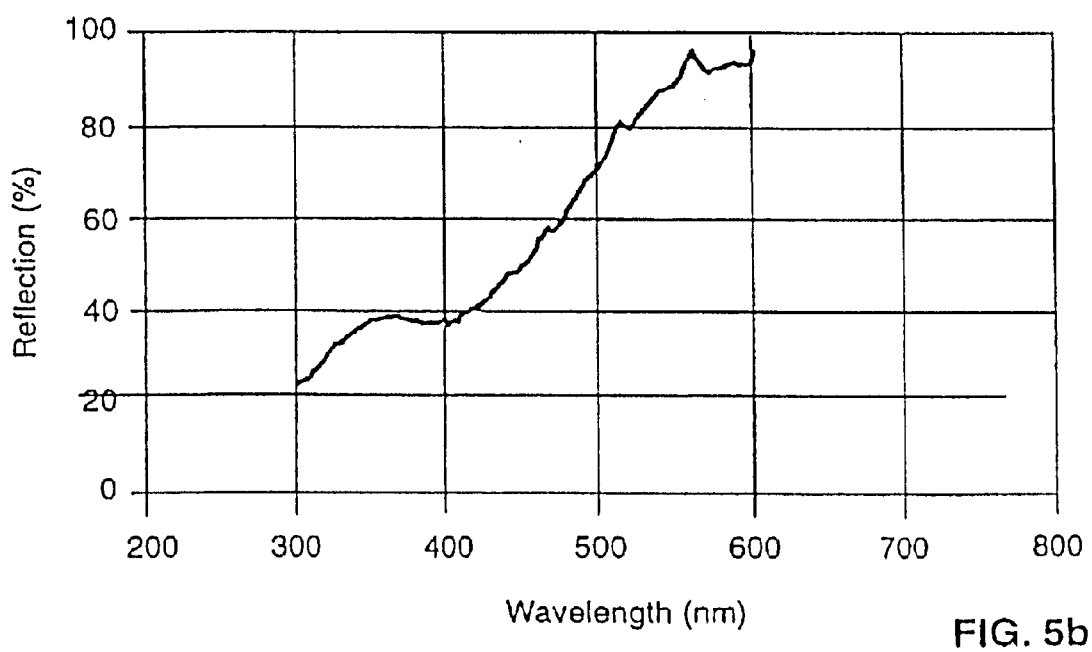

FIGS. 3 to 5 show the emission and the reflection of various sialons as a function of the wavelength.

Specifically, FIG. 3a shows the emission spectrum of the sialon $Ca_{1.5}Al_3Si_9N_{16}:Eu^{2+}$ (2%) (test number HU13/01) with excitation by 400 nm. The maximum is at 579 nm, and the mean wavelength at 590 nm. The quantum efficiency QE is 79%. At 400 nm, the reflection (FIG. 3b) is approximately R400=51% and, at 460 nm, approximately R460=64%. This data is also listed in table 1, together with a range of further phosphors. Furthermore, FIG. 3c shows the emission spectrum of this sialon $Ca_{1.5}Al_3Si_9N_{16}:Eu^{2+}$ (2%) (test number HU13/01) with excitation by 460 nm. The maximum is at 590 nm, the mean wavelength at 597 nm. The quantum efficiency QE is 78%. The reflection (FIG. 3d) is approximately R400=51% at 400 nm and approximately R460=64% at 460 nm.

The synthesis of the sialon HU13/01 is described more accurately below, by way of example.

The phosphor powder is produced by means of a high-temperature solid-state reaction. For this purpose, by way of example, the high-purity starting materials $Ca_3N_2$, AlN, and $Si_3N_4$ are mixed, with a molar ratio of 1.5:3:9. The grain size of the $Si_3N_4$ is $d_{50}=1.6$ μm, with $d_{10}=0.4$ and $d_{90}=3.9$ μm. For the purpose of doping, a small quantity of $Eu_2O_3$ is added, replacing the corresponding molar amount of $Ca_3N_2$. If the Eu amounts to 2 mol %, this corresponds to the empirical formula $(Ca_{1.47}Eu_{0.30})Al_3Si_9N_{16}$. On account of the addition of oxygen together with the Eu as Eu oxide, the precise empirical formula is to be considered to be $(Ca_{1.47}Eu_{0.30})Al_3Si_9O_{0.04}N_{15.97}$. In this case, therefore, the general empirical formula is $M_{p/2}Si_{12-p-q}Al_{p+q}O_{1.5q}N_{16-q}$:$Eu^{2+}$.

After the individual components have been intimately mixed, the powder is heated at approx. 1700° C. for 1–2 h in a reducing atmosphere ($N_2/H_2$) and thereby reacts to form the compound described above.

FIG. 4 shows the emission spectrum of the sialon $Ca_{1.5}Al_3Si_9N_{16}$:$Eu^{2+}$ (4%) (test number HU14/01) with excitation by 400 nm. The maximum is at 588 nm, the mean wavelength at 595 nm. The quantum efficiency QE is 76%. The reflection (FIG. 4b) is approximately R400=40% at 400 nm and approximately R460=54% at 460 nm.

FIG. 5 shows the emission spectrum for the sialon $CaSr_{0.5}Al_3Si_9N_{16}$:$Eu^{2+}$ (4%) (test number HU15/01) with excitation by 400 nm. The maximum is at 588 nm, the mean wavelength at 594 nm. The quantum efficiency QE is 70%. The reflection (FIG. 4b) is approximately R400=36% at 400 nm and approximately R460=50% at 460 nm.

Figure 6A:
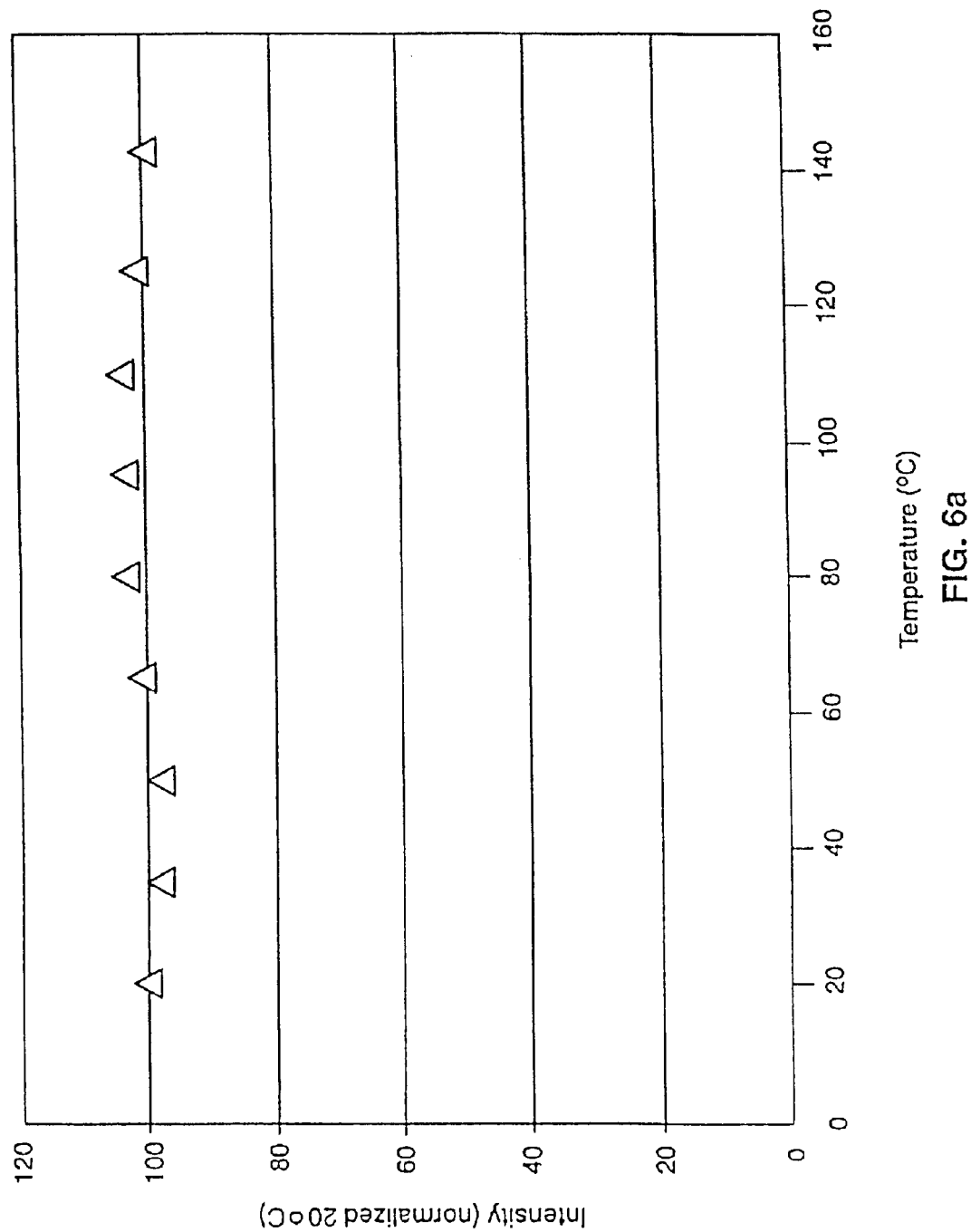
Figure 6B:
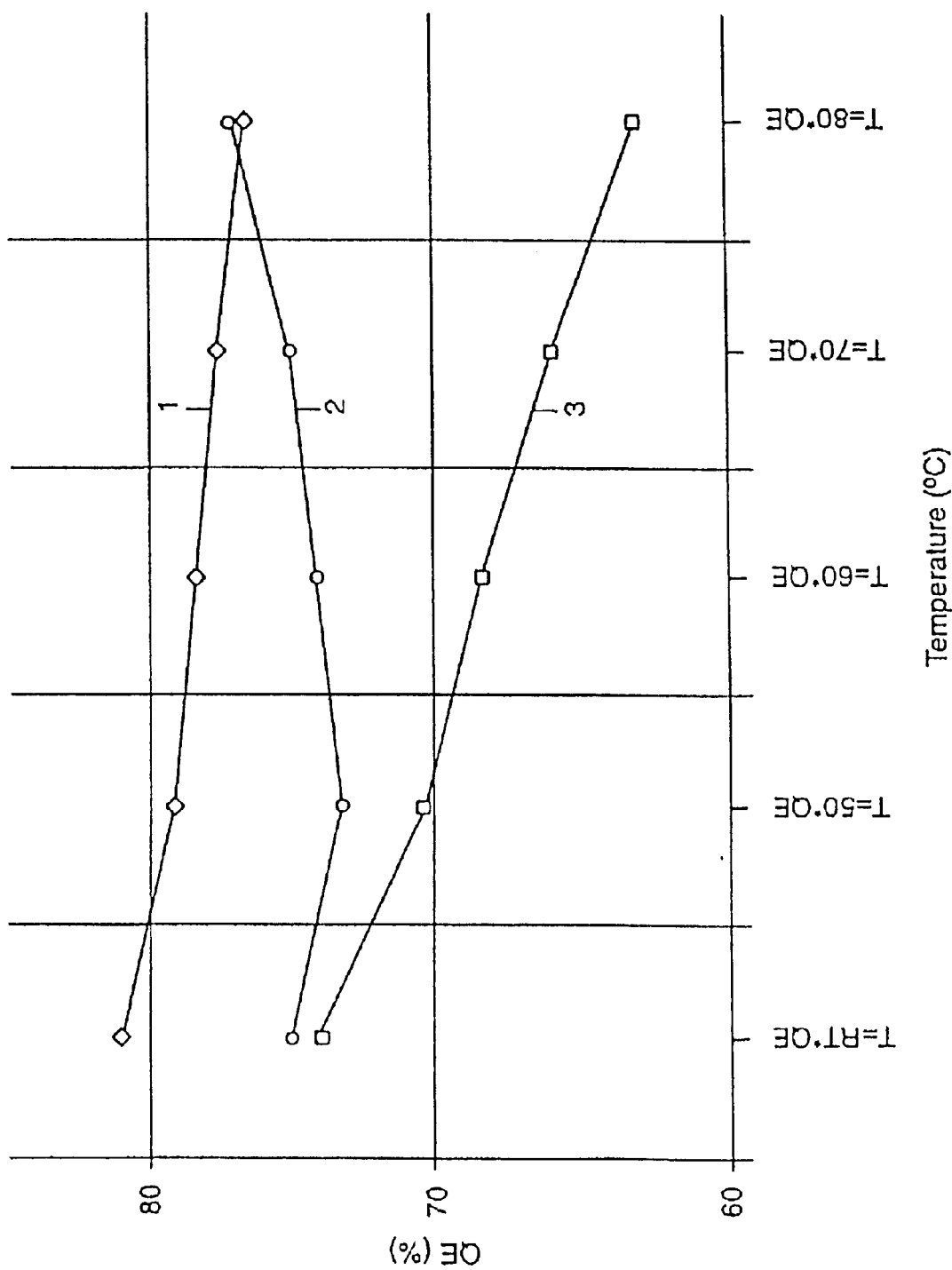

FIG. 6 shows the quantum efficiency as a function of the temperature for various phosphors. It can be seen that although pure YAG:Ce (curve 1) has a significantly higher quantum efficiency at room temperature than a typical sialon (curve 2: in this case HU16/01 from table 1), namely 81% compared to 75%, amazingly, the quantum efficiency when the LEDs are operating under typical thermal loads of 80° C. are completely identical. Therefore, while at first glance the Eu-doped sialon phosphors appear to give only average results (at room temperature), their suitability for lucoleds and other thermally loaded illumination units are directly comparable to the YAG:Ce used as standard. In illumination units of this type, normally a Gd-modified garnet is always used as well in order to improve the color rendering. However, unlike pure YAG:Ce, a modification of the YAG:Ce (50 mol % of Gd instead of Y) immediately leads to considerably worse results under thermal loads.

TABLE 2

| Phosphor | Light efficiency relative to YAG:Ce | Ra | Color coordinate x | Color coordinate y |
| --- | --- | --- | --- | --- |
| YAG:Ce | 100% | 79 | 0.304 | 0.326 |
| YAG:Ce and (Y, Gd) AG:Ce | 95% | 83 | 0.320 | 0.310 |
| YAG:Ce and sialon HU34/01 | 106% | 81 | 0.319 | 0.311 |
| TbAG:Ce and sialon HU34/01 | 100% | 83 | 0.336 | 0.305 |
| Chlorosilicate and sialon HU34/01 | 104% | 82 | 0.325 | 0.309 |

This shows that the Eu-doped sialons are particularly suitable for use in luminescence conversion LEDs and in particular in phosphor mixtures together with YAG:Ce or other thermally stable phosphors.

Figure 7:
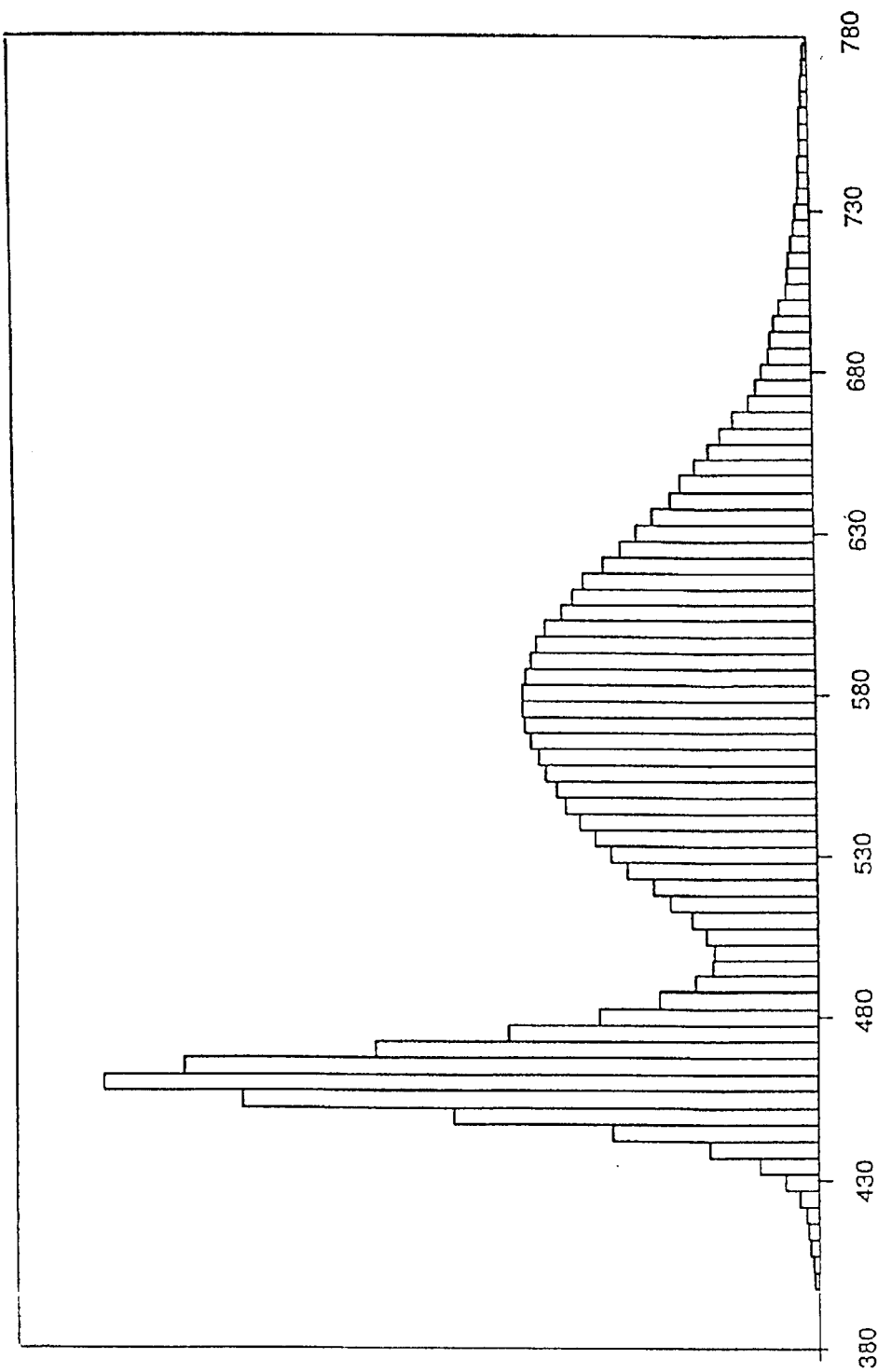
FIG. 7 shows a) the temperature behavior of sialon HU 13/01 on an absolute basis and b) the temperature behavior of garnet phosphors and sialon phosphor on a comparative basis.

FIG. 7 shows the emission spectrum for a luminescence conversion LED (lukoled) based on a blue InGaN-LED with primary emission at 460 nm using a mixture of YAG:Ce and an EU-doped sialon HU34/01 from table 1. Although the color rendering is slightly worse than with a corresponding mixture of YAG:Ce and (Y,Gd)AG:Ce, the efficiency is 6% higher. By comparison, when YAG:Ce is used on its own as phosphor, both the light efficiency and the color rendering are significantly worse, cf. in this respect table 2.

Table 2 also shows that other phosphors mixed with sialon have a high efficiency as well. This applies in particular to a mixture with Ce-doped TbAG or with Eu-doped chlorosilicate (cf. for example WO 01/93342, in which both phosphors are described in more detail, with further cross-references). Depending on the relative amounts, it is known that it is possible to achieve various color loci on the connecting line between the color loci of the pure phosphors.

Figure 8:
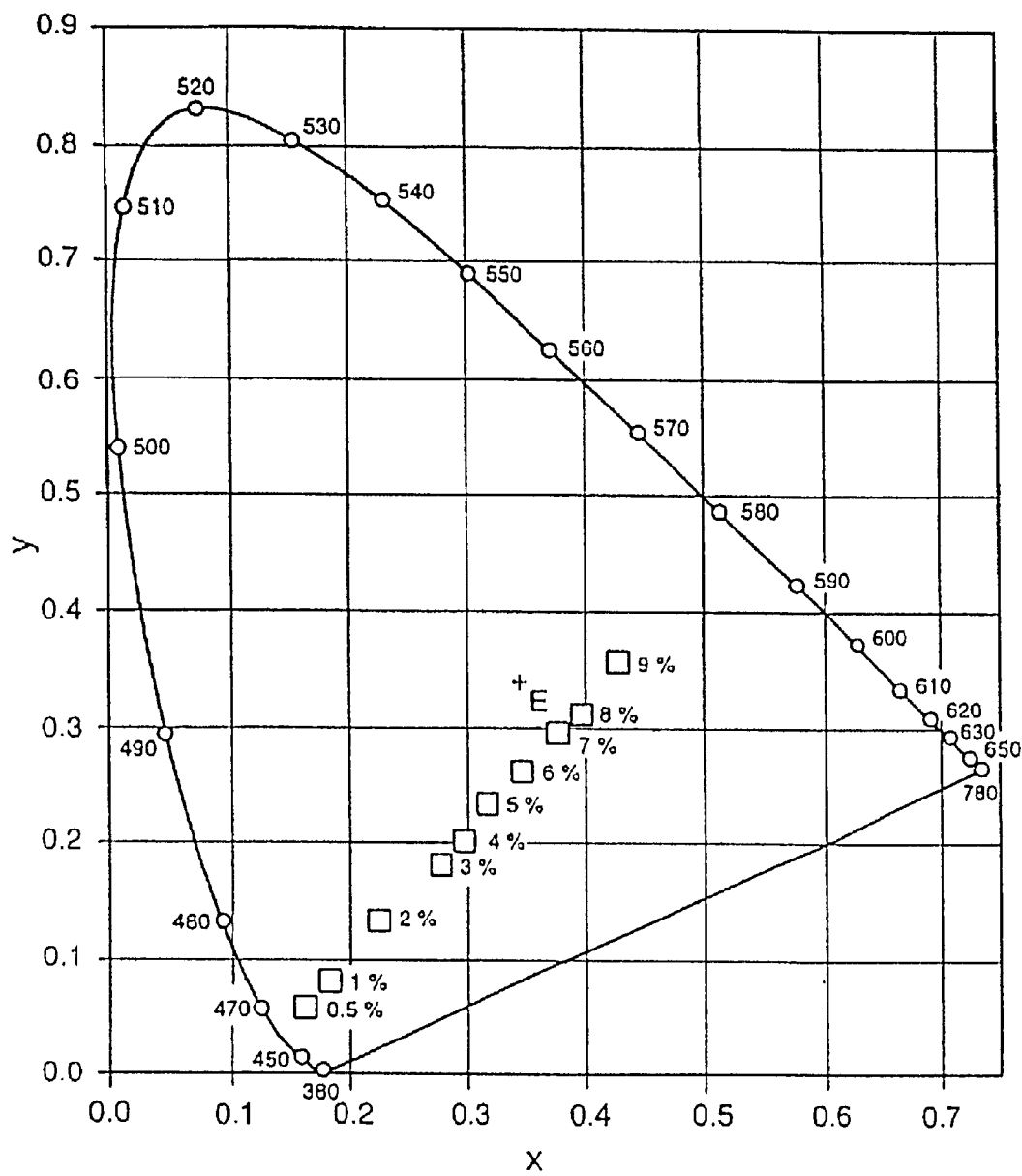
FIG. 8 shows the emission spectrum for a LED with the phosphors YAG and sialon in accordance with the present invention.

FIG. 8 shows the color loci of a mixture between a blue LED (460 nm) and a YO phosphor on its own for proportions of from 0.5 to 9% of the YO phosphor in the mixture. In this way, it is possible to produce a colored LED of the desired color. It is possible to achieve color loci on the connecting line (disregarding secondary effects such as a slight influence of the casting resin) which lie in the blue, in the pink color through to yellow-orange.

TABLE 1

| Compound | Short designation | QE | R370 | R400 | R460 | Max Em. | x | y |
| --- | --- | --- | --- | --- | --- | --- | --- | --- |
| $Ca_{1.5}Al_3Si_9N_{16}$:$Eu^{2+}$ (2%) | HU13/01 | 79 | | 51 | 64 | 580 | 0.498 | 0.490 |
| $Ca_{1.5}Al_3Si_9N_{16}$:$Eu^{2+}$ (4%) | HU14/01 | 76 | | 40 | 54 | 588 | 0.515 | 0.477 |
| $Ca_{1.5}Al_3Si_9N_{16}$:$Eu^{2+}$ (4%) | HU16/01 | 75 | | 41 | 57 | 583 | 0.510 | 0.481 |
| $Ca_{1.5}Al_3Si_9N_{16}$:$Eu^{2+}$ (6%) | HU33/01 | 76 | | 39 | 54 | 587 | 0.518 | 0.474 |
| $Ca_{1.5}Al_3Si_9N_{16}$:$Eu^{2+}$ (8%) | HU34/01 | 70 | | 36 | 48 | 588 | 0.525 | 0.468 |
| $CaAl_2Si_{10}N_{16}$:$Eu^{2+}$ (6%) | HU54/01 | 81 | 56 | 57 | 71 | 576 | 0.479 | 0.504 |
| $CaSr_{0.5}Al_3Si_9N_{16}$:$Eu^{2+}$ (4%) | HU15/01 | 70 | | 36 | 50 | 588 | 0.508 | 0.479 |
| $Ca_{1.5}Al_{3.5}Si_{8.5}O_{0.5}N_{15.5}$:$Eu^{2+}$ (4%) | HU56/01 | 64 | 55 | 55 | 67 | 582 | 0.488 | 0.496 |
| $Ca_{1.5}Al_{2.7}Ga_{0.3}Si_9N_{16}$:$Eu^{2+}$ (8%) | TF39/01 | 43 | 16 | 18 | 30 | 594 | 0.530 | 0.463 |
| $Sr_{1.5}Al_3Si_9N_{16}$:$Eu^{2+}$ (4%) | HU19/01 | 41 | 44 | 49 | 62 | 512 | 0.307 | 0.509 |

What is claimed is:

1. An illumination unit having at least one LED as light source, the LED emitting primary radiation in the range from 300 to 485 nm, this radiation being partially or completely converted into longer-wave radiation by phosphors which are exposed to the primary radiation of the LED, wherein conversion takes place at least with the aid of a phosphor which emits yellow-orange with a peak emission wavelength at 540 to 620 nm and originates from the class of the Eu-activated sialons, the sialon corresponding to the formula $M_{p/2}Si_{12-p-q}Al_{p+q}O_qN_{16-q}$:$Eu^{2+}$, where M=Ca individually or in combination with at least one of the metals Sr or Mg, where q=0 to 2.5 and p=0.5 to 3.

2. The illumination unit as claimed in claim 1, wherein the Al is partially (up to 20 mol %) replaced by Ga.

3. The illumination unit as claimed in claim 1, wherein q<1 and/or p=2 to 3 is selected.

4. The illumination unit as claimed in claim 1, wherein the mean grain diameter of the phosphor powder is selected to be between 0.5 and 5 μm.

5. The illumination unit as claimed in claim 1, wherein, to generate white light, the primary radiation emitted is in the wavelength region from 330 to 370 nm, the primary radiation emitted being exposed to at least two phosphors with an emission maximum in the blue (430 to 470 nm) and yellow-orange (in particular 545 to 590 nm) for conversion.

6. The illumination unit as claimed in claim 5, wherein the primary radiation is also exposed to at least one further phosphor, which emits either in the green (490 to 525 nm) or in the red (625 to 700 nm), for conversion.

7. The illumination unit as claimed in claim 6, wherein the further phosphor is a chlorosilicate or an Y- or Tb-based garnet.

8. The illumination unit as claimed in claim 1, wherein, to generate white light, the primary radiation emitted lies in the blue wavelength region of 430 to 470 nm, the primary blue radiation emitted being exposed to two phosphors with an emission maximum in the yellow-orange (545 nm to 590 nm) and in the green (490 to 525 nm).

9. The illumination unit as claimed in claim 1, wherein, to generate colored light, the primary radiation emitted lies in the blue wavelength region from 430 to 485 nm, the primary blue radiation emitted being exposed to a single phosphor having an emission maximum in the yellow-orange (545 nm to 590 nm).

10. The illumination unit as claimed in claim 9, wherein the proportion of the yellow-orange phosphor in the mixture is approximately 0.5 to 15%.

11. The illumination unit as claimed in claim 1, characterized in that the primary radiation source used is a light-emitting diode which emits at a short wavelength and is based in particular on Ga(In)N.

12. The illumination unit as claimed in claim 1, wherein the proportion of the Sr and/or Mg amounts to at most 40 mol % of the cation M.

13. The illumination unit as claimed in claim 1, wherein the illumination unit is a luminescence conversion LED, in which the phosphors are in direct or indirect contact with the chip.

14. The illumination unit as claimed in claim 1, wherein the illumination unit is an array of LEDs.

15. The illumination unit as claimed in claim 14, wherein at least one of the phosphors is applied to an optical device arranged in front of the LED array.

* * * * *